(12) United States Patent
Sakai et al.

(10) Patent No.: US 8,713,792 B2
(45) Date of Patent: May 6, 2014

(54) METHOD OF MANUFACTURING A PRINTED WIRING BOARD

(75) Inventors: Taiji Sakai, Kawasaki (JP); Seiki Sakuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 130 days.

(21) Appl. No.: 12/908,404

(22) Filed: Oct. 20, 2010

(65) Prior Publication Data

US 2011/0031002 A1 Feb. 10, 2011

Related U.S. Application Data

(63) Continuation of application No. PCT/JP2008/058427, filed on May 2, 2008.

(51) Int. Cl.
*H01R 9/00* (2006.01)
*H05K 3/00* (2006.01)

(52) U.S. Cl.
USPC ............... 29/843; 29/825; 29/829; 29/831; 29/846

(58) Field of Classification Search
USPC .......... 29/843, 825, 829, 831, 837, 846, 876; 174/126.1, 126.2, 257; 428/618, 646, 428/668, 689
See application file for complete search history.

(56) References Cited

U.S. PATENT DOCUMENTS 7,547,479 B2 * 6/2009 Wessling ............... 428/646
2003/0121959 A1 7/2003 Yamaguchi et al.

FOREIGN PATENT DOCUMENTS

| JP | 2001-274201 A | 10/2001 |
| JP | 2003-174252 A | 6/2003 |
| JP | 2003-198117 A | 7/2003 |
| JP | 2007-275917 A | 10/2007 |

OTHER PUBLICATIONS

International Search Report of PCT/JP2008/058427, mailing date Jun. 24, 2008.

* cited by examiner

*Primary Examiner* — Thiem Phan
(74) *Attorney, Agent, or Firm* — Westerman, Hattori, Daniels & Adrian, LLP

(57) ABSTRACT

A printed wiring board includes a Cu wiring pattern formed on a substrate. A first metal layer is formed on the Cu wiring pattern. A second metal layer is formed on the first metal layer. The first metal layer has a less reactivity with Cu than the second metal layer. The first metal layer and the second metal layer together cause an eutectic reaction.

4 Claims, 19 Drawing Sheets

METHOD OF MANUFACTURING A PRINTED WIRING BOARD

CROSS-REFERENCE TO RELATED APPLICATIONS

This application is a U.S. continuation application, filed under 35 USC 111(a) and claiming the benefit under 35 USC 120 and 365(c), of PCT application JP2008/058427 filed May 2, 2008. The foregoing application is hereby incorporated herein by reference.

FIELD

The embodiment discussed herein is directed to a printed wiring board used in electronic equipments and a manufacturing method of such a printed wiring board.

BACKGROUND

In recent electronic equipments including a cellular phone, a digital camera, etc., a severe demand is placed in speeding up an operation. In order to satisfy such a demand, it is required to use a so-called low-K material such as a porous silica for an interlayer insulating material of a semiconductor chip in order to reduce a parasitic capacitance generated between wiring patterns.

However, a low-K material is generally a mechanically brittle material, and tends to receive a damage due to a thermal strain generated during a joining process of a semiconductor chip. For example, a porous silica has a modulus of elasticity of 4 GPa to 8 GPa and, thereby, a mechanical strength of the porous silica is smaller than that of conventionally used interlayer insulating materials.

For this reason, a joining process to join a semiconductor chip using such a low-K material is performed at a low temperature in order to reduce a thermal strain generated in a substrate during the joining process. However, because a conventionally used lead-free solder requires a joining temperature of 217° C. or higher, it has been difficult to mount a semiconductor chip, in which a low-K material is used, on a printed wiring board.

In view of such a situation, Japanese Laid-Open Patent Application No. 2001-274201 suggests a technique to form a solder layer on a Cu wiring pattern on a printed wiring board, the solder layer having a lamination structure in which a tin (Sn) layer and a bismuth (Bi) layer are stacked sequentially. According to such a technique, it is considered that the solder layer fuses at a temperature of 139° C. according to an eutectic reaction of Sn and Bi, which enables joining a device such as a semiconductor chip or the like to connection electrodes at a low temperature.

Japanese Laid-Open Patent Application No. 2003-174252 also discloses a technique similar to the technique suggested in Japanese Laid-Open Patent application No. 2001-274201.

In the printed wiring board having an Sn layer directly formed on a Cu layer, Sn atoms in the Sn layer move into the Cu layer due to diffusion during a plated film producing process to form the Sn layer, which may cause a problem in that an intermetallic compound $Cu_6Sn_5$ is formed in a Cu electrode pad. As a result of formation of such an intermetallic compound, the Sn layer, which is formed on the Cu electrode pad, is consumed. Thus, even if a Bi layer is formed on the Cu electrode pad, the desired eutectic reaction cannot be produced.

In order to eliminate such a problem, according to the technique suggested in the above-mentioned patent document, it is required to set the film thickness of the Sn layer formed on the Cu layer large enough so that a depletion of Sn atoms does not occur and the Sn layer remains on the Cu electrode pad even if a large amount of Sn atoms are moved into the Cu electrode pad. However, according to such a structure, the film thickness of the Sn layer must be increased, which may cause a problem in that short-circuiting occurs between adjacent electrode pads through a thick solder layer when forming minute patterns with fine pitches.

SUMMARY

According to an aspect of the invention, a printed wiring board includes: a substrate; a Cu wiring pattern formed over the substrate; a first metal layer formed on the Cu wiring pattern; a second metal layer formed on the first metal layer, wherein the first metal layer has a less reactivity with Cu than the second metal layer, and the first metal layer and the second metal layer together cause an eutectic reaction.

According to another aspect of the invention, a manufacturing method of an electronic device, includes: placing the electronic device on the above-mentioned printed wiring board so that terminals of the electronic device are brought into contact with the second metal layer; and reflowing the first and second metal layers to join the terminals of the electronic device to the Cu wiring pattern.

According to a further aspect of the invention, a manufacturing method of a printed wiring board includes: forming a first metal layer on a Cu wiring pattern formed on a substrate; forming a second metal layer on the first metal layer, the second metal layer producing an eutectic reaction with the first metal layer; and reflowing the first and second metal layers to produce the eutectic reaction between the first and second metal layers, wherein the first metal layer has a less reactivity with Cu than the second metal layer.

The object and advantages of the embodiment will be realized and attained by means of the elements and combinations particularly pointed out in the appended claims.

It is to be understood that both the foregoing general description and the following detailed description are exemplary explanatory only and are not restrictive of the invention, as claimed.

DESCRIPTION OF EMBODIMENT(S)

Embodiments of the present invention will be explained with reference to the accompanying drawings.

Figure 1:
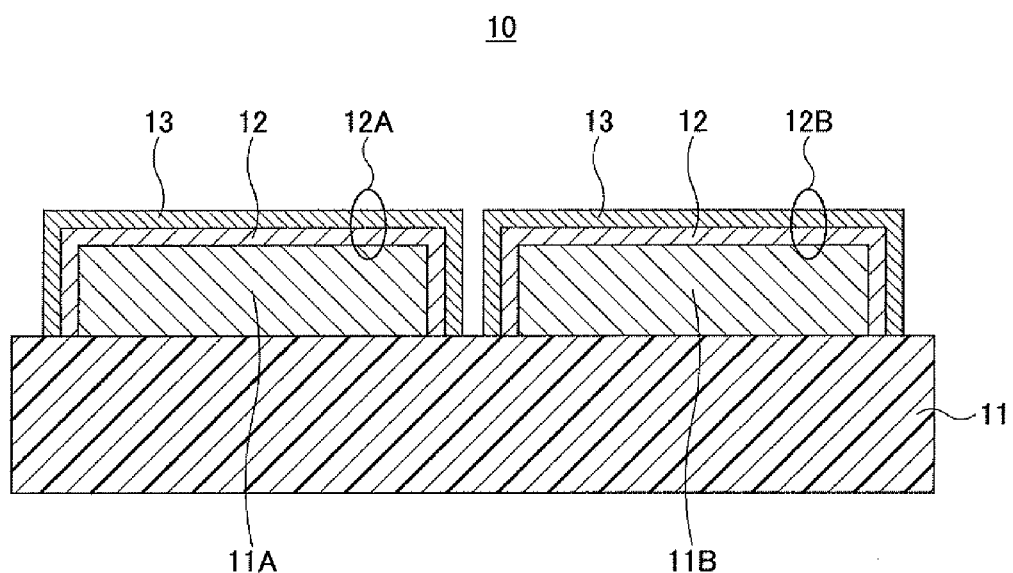
FIG. 1 is a cross-sectional view of a part of a printed wiring board according to a first embodiment.

FIG. 1 illustrates a printed wiring board according to a first embodiment. The printed wiring board 10 illustrated in FIG. 1 includes a substrate 11 formed of an epoxy resin material. Cu wiring patterns 11A and 11B are formed on the substrate 11.

Each of the Cu wiring patterns forms an electrode pad. Hereinafter, the Cu wiring patterns 11A and 11B may be referred to as Cu electrode pads 11A and 11B, respectively. Solder layers 12A and 12B are formed on the Cu electrode pads 11A and 11B, respectively. Each of the solder layers 12A and 12B has a Sn/Bi lamination structure in which a bismuth (Bi) layer 12 and a tin (Sn) layer 13 are stacked in that order.

In the above-mentioned structure, the Bi layer 12 directly contacts with the Cu electrode pads 11A or 11B. Because bismuth (Bi) does not form an intermetallic compound with copper (Cu), an amount of Bi atoms diffused into the Cu electrode pads 11A and 11B is negligibly small. Thus, there is no situation happens in that the Bi layer 12 is depleted. Thus, when the Sn layer 13 is formed on the Bi layer 12, the Bi layer 12 and the Sn layer 13 surely produce an eutectic reaction due to heat applied in a reflowing process, and, thereby, the solder layers 12A and 12B can fuse surely at a temperature below 200° C.

Figure 2A:
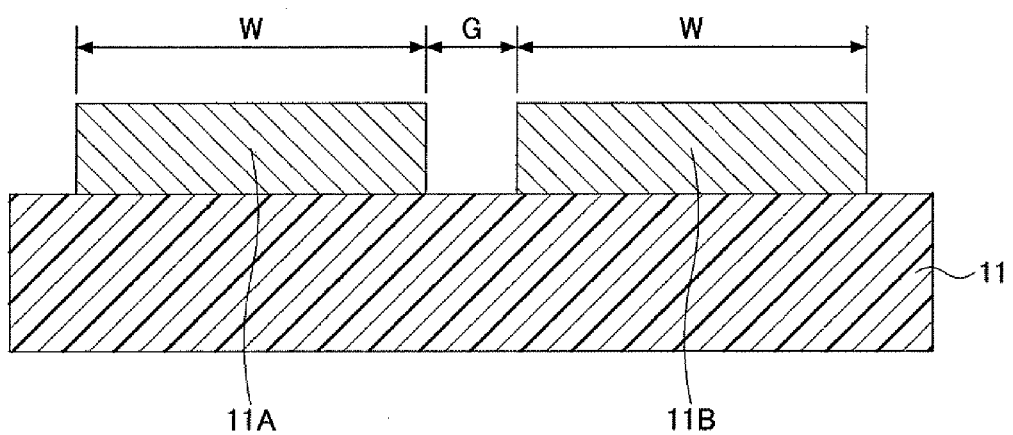
FIG. 2A is a cross-sectional view for explaining a manufacturing process of the printed wiring board illustrated in FIG. 1.

In the present embodiment, as illustrated in FIG. 2A, the Cu wiring layers forming the Cu electrode pads 11A and 11B are formed on the substrate 11 with a pitch of 25 μm according to an electroless plating method or an electrolytic plating method using a resist pattern. A width of each of the Cu electrode pads 11A and 11B is set to 20 μm. As a result, an interval G between the Cu electrode pads 11A and 11B is 5 μm.

In the process illustrated in FIG. 2A, the Cu electrode pads 11A and 11B formed on the substrate 11 are washed with a 10% sulfuric acid solution for 30 seconds, and, then, washed with pure water for 30 seconds, and, thereafter, dried in a dry nitrogen atmosphere.

Figure 2B:
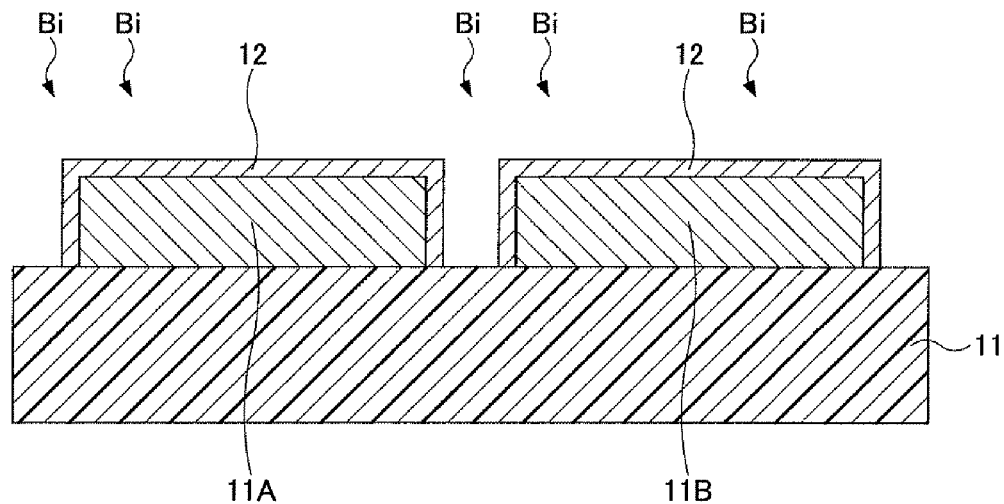
FIG. 2B is a cross-sectional view for explaining a manufacturing process of the printed wiring board illustrated in FIG. 1.

Then, the thus-obtained electrode structure is subjected to a Bi plating process using Bi electroless plating in order to form the Bi layer 12 having an average film thickness of about 1 μm on surfaces of each of the Cu electrode pads 11A and 11B as illustrated in FIG. 2B. Hereinafter, the Bi layer 12 may be referred as a Bi-plated layer 12.

Figure 3:
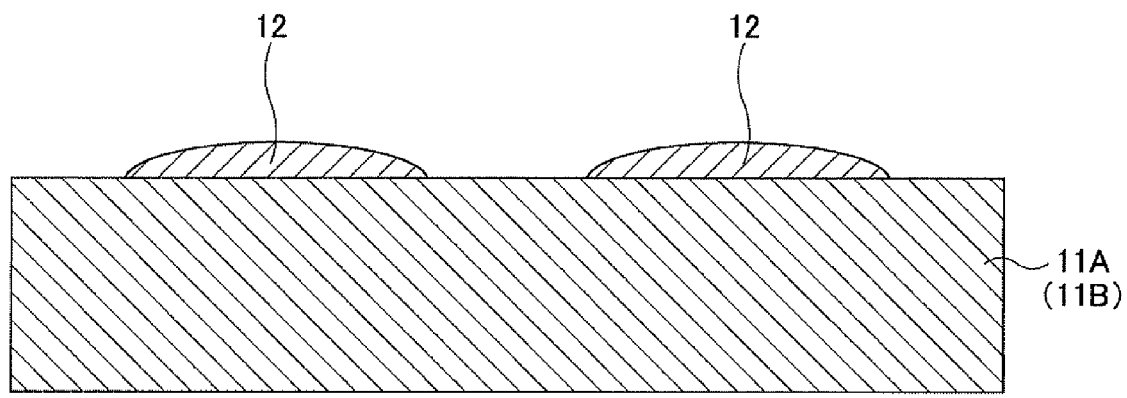
FIG. 3 is an enlarged cross-sectional view of a part of FIG. 2B.

However, in the process illustrated in FIG. 2B, a substitution reaction in the electroless plating does not occur at a high rate on the surfaces of the Cu electrode pads 11A and 11B. For this reason, the Bi-plated layer 12 is not deposited uniformly on the surfaces of the Cu electrode pads 11A and 11B, and the Bi-plated layer 12 is deposited in an islet form as illustrated in FIG. 3. The thus-deposited Bi-plating layer 12 includes islands each having a size of 2 μm to 5 μm. It should be noted that FIG. 3 is an enlarged illustration of a part of the surface of the Cu electrode pads 11A or 11B illustrated in FIG. 2B.

In the Bi electroless plating process illustrated in FIG. 2B, the Bi-plated layer 12 is formed by electroless plating at 70° C. for 5 minutes using an electroless plating solution, which contains 1 to 10 g/L of bismuth nitrate, 5 to 60 g/L of thiocarbonic acid and 5 to 10 g/L of nitric acid. According to the above-mentioned plating condition, the Bi-plated layer 12 can be formed to cover about 60% of the surface area of each of the Cu electrode pads 11A and 11B.

Subsequent to the electroless plating process of the Bi-plated layer 12, the electrode structure illustrated in FIG. 2B is washed with pure water for 30 seconds. Then, the surfaces of the Cu electrode pads 11A and 11B are washed with a 10% sulfuric acid solution for 20 seconds, and, then, washed with pure water for 30 seconds.

Figure 2C:
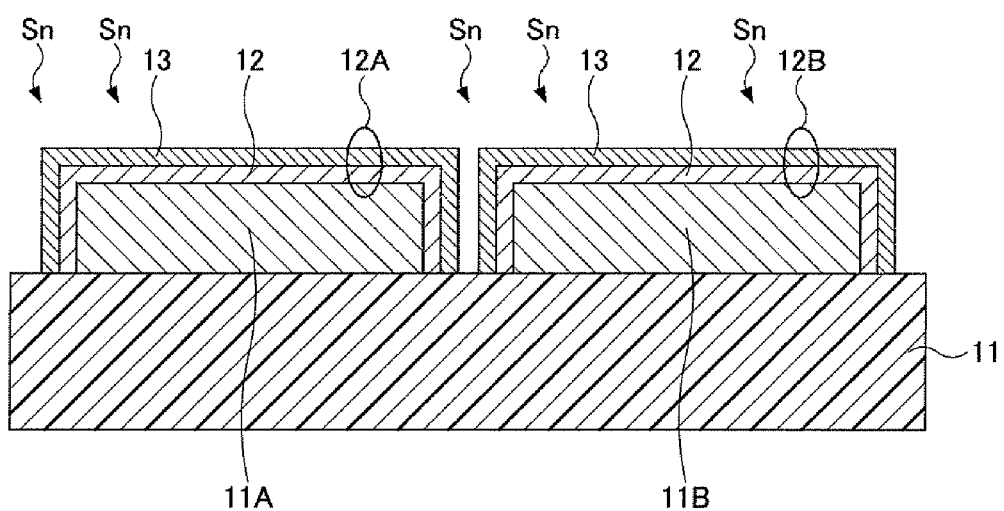
FIG. 2C is a cross-sectional view for explaining a manufacturing process of the printed wiring board illustrated in FIG. 1.

Subsequently, in the process of FIG. 2C, the Sn layer 13 (hereinafter, may be referred to as Sn-plated layer 13) is formed with a film thickness of about 1 μm on the thus-washed electrode structure by an Sn electroless plating, which results in formation of the printed wiring board 10 having the laminated solder layers 12A and 12B as illustrated in FIG. 1. For example, in the process of FIG. 2C, the Sn-plated layer 13 is formed by electroless plating at 70° C. for 10 minutes using an electroless plating solution, which contains 20 g/L of $SnCl_2$, 70 g/L of $CS(NH_2)_2$, 50 g/L of hydrochloric acid, 15 g/L of $NaHPO_2.2H_2O$, and 0.5 g/L of surfactant.

Figure 4:
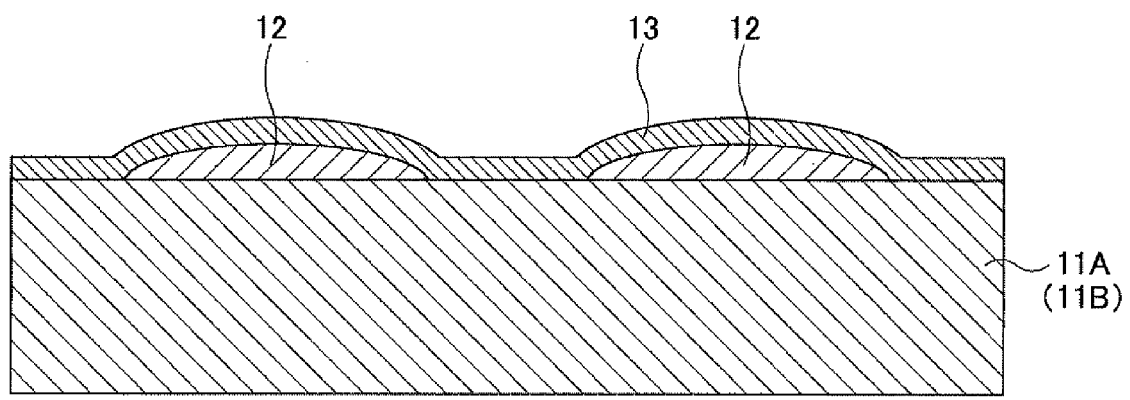
FIG. 4 is an enlarged cross-sectional view of a part of FIG. 2C.

Consequently, as illustrated in FIG. 4, the Sn-plated layer 13 is formed on the Cu electrode pads 11A and 11B to cover the island-formed Bi-plated layer 12. In the present embodiment, the Sn-plated layer 13 is formed with the same film thickness as the Bi-plated layer 12 in consideration of the eutectic composition (Sn42 wt %-Bi58 wt %).

Although the thus-formed Sn-plated layer 13 is partly in contact with the Cu electrode pad 11A or 11B as illustrated in FIG. 4, the area of the contact part is relatively small. Thus, when the laminated solder layers 12A and 12B in the electrode structure illustrated in FIG. 2C are subject to a reflowing process, it is possible to cause an effective eutectic reaction to be produced between the Bi-plated layer 12 and the Sn-plated layer 13.

Figure 5A:
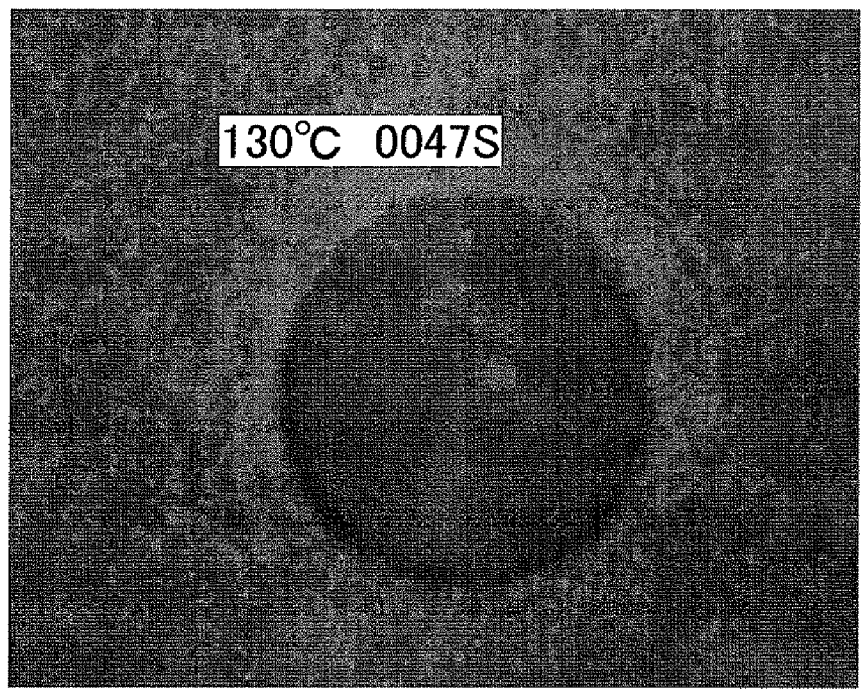
FIG. 5A is an illustration illustrating a Sn—Bi eutectic solder formed on a Cu pattern.
Figure 5B:
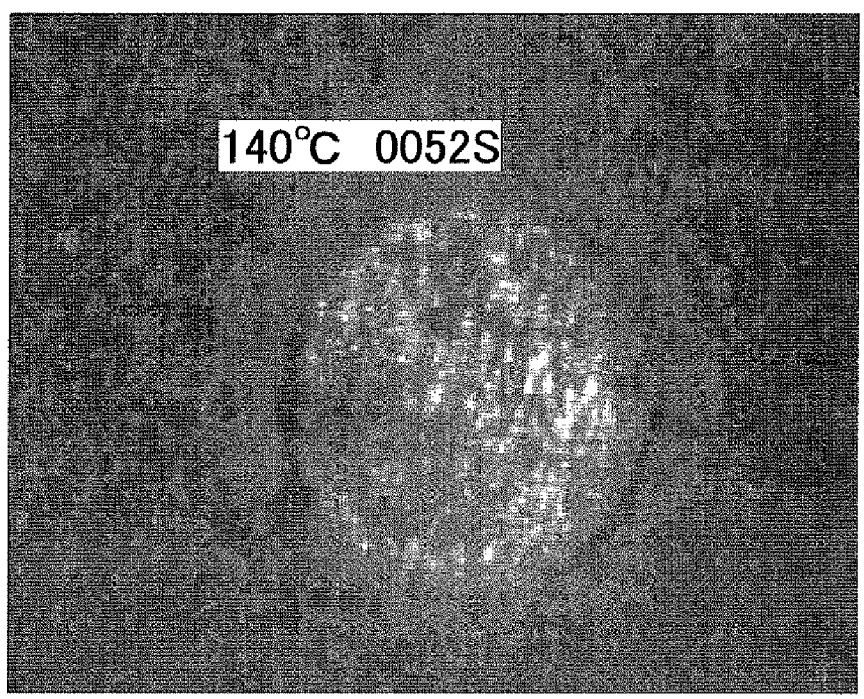
FIG. 5B is an illustration illustrating a Sn—Bi eutectic solder formed on a Cu pattern.
Figure 5C:
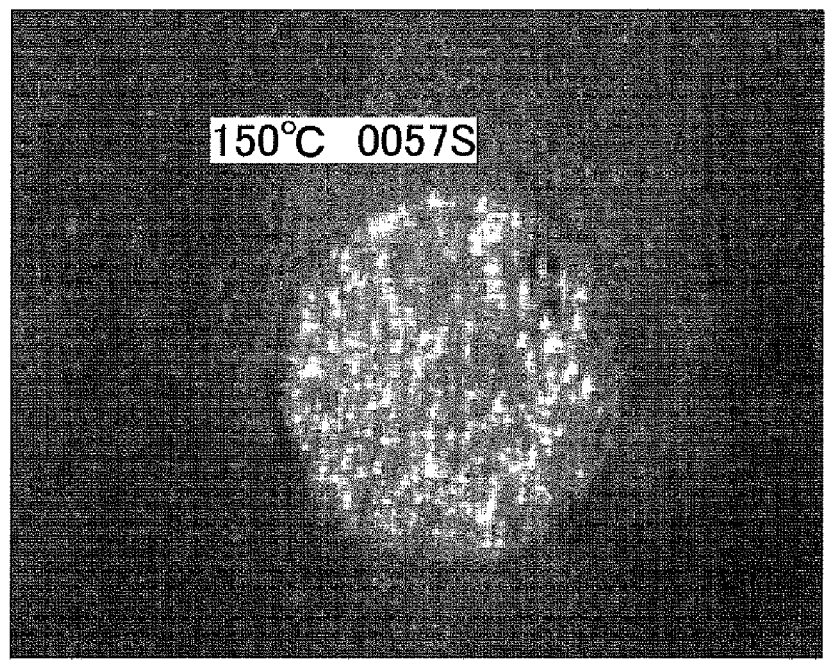
FIG. 5C is an illustration illustrating a Sn—Bi eutectic solder formed on a Cu pattern.

FIGS. 5A through 5C illustrates results of experiments of reflowing by applying heat to a sample containing a solder layer in which a Bi-plated layer and a Sn-plated layer are laminated as the same as the printed wiring board 10 of FIG. 1. In the sample illustrated in FIGS. 5A through 5C, the Bi-plated layer and the Sn-plated layer were formed on a circular Cu pattern by the process of FIGS. 2A through 2C.

In the experiments, the Bi-plated layer was directly formed on the Cu pattern with an average film thickness of about 1.0 μm, and the Sn-plated layer was formed on the Bi-plated layer with an average film thickness of about 0.7 μm. In the experiments, a flux of an RMA-type flux was applied to the surface of the sample and the sample was heated at a heating rate of 2° C./min.

Although FIG. 5A illustrates the state of the sample surface at a time when the sample temperature reached 130° C., there was no change in the state of the sample surface from a time of start heating.

On the other hand, FIG. 5B illustrates the state of the sample surface at a time when the sample temperature reached 140° C., which slightly exceeds the Sn—Bi eutectic temperature of 139° C. Referring to FIG. 5B, it is appreciated that melting occurred in the solder layer covering the surface, which results in bright white portions appearing in the sample surface.

FIG. 5C illustrates the state of the sample surface at the time when the sample temperature was raised up to 150° C. It is appreciated that the melting of the solder layer had been continuously occurred.

According to the above-mentioned experiments, it was found that melting occurs in the solder layers 12A and 12B of the Bi-plated layer 12 and the Sn-plated layer 13 at the temperature of 140° C. Thus, it was confirmed that Sn atoms are effectively prevented from being diffused into the Cu electrode pad 11A or 11B in a large part of the Sn-plated layer 13 and the melting occurs near the eutectic temperature of 139° C. even if a part of the Sn-plated layer 13 is in direct contact with the Cu electrode pads 11A or 11B as illustrated in FIGS. 3 and 4. It is considered that this is an effect of the Bi-plated layer 12 being interposed between the Sn-plated layer 13 and the Cu electrode pad 11A or 11B.

The following Table 1 indicates results of comparison between the sample according to the structure of FIG. 1 of the present embodiment and comparison samples. The samples No. 1 through No. 3 are comparison samples corresponding to a conventional structure in which the order of the Bi-plated layer 12 and the Sn-plated layer 13 are changed. The sample No. 4 corresponds to the structure illustrated in FIG. 1 according to the present embodiment. The samples No. 5 and No. 6 are comparison samples in which the thicknesses of the Bi-plated layer 12 and the Sn-plated layer 13 are varied. In the samples No. 1 through No. 6, the Cu electrode pads 11A and 11B having a width W of 20 μm are arranged at an interval of 5 μm. Indicated in the Table 1 are whether a SnCu diffusion such as an intermetallic compound $Cu_6Sn_5$ is formed in a state immediately after the formation of the Sn-plated layer 13, whether the solder layers 12A and 12B are fused in a state after a reflowing process at 180° C. is carried out, and whether short-circuiting occurs between the adjacent Cu electrode pads 11A and 11B.

TABLE 1

| | FIRST METAL | | SECOND METAL | | SnCu | | SHORT-CIRCUIT BETWEEN |
|---|---|---|---|---|---|---|---|
| | KIND OF METAL | FILM THICKNESS | KIND OF METAL | FILM THICKNESS | DIFFUSION LAYER | SnBi FUSION | ADJACENT ELECTRODES |
| 1 | Sn | 1 μm | Bi | 1 μm | 1 μm | x | NO |
| 2 | Sn | 2 μm | Bi | 1 μm | 1.5 μm | Δ | YES |
| 3 | Sn | 3 μm | Bi | 1 μm | 1.5 μm | ○ | YES |
| 4 | Bi | 1 μm | Sn | 1 μm | 0 μm | ○ | NO |
| 5 | Bi | 2 μm | Sn | 1 μm | 0 μm | ○ | YES |
| 6 | Bi | 3 μm | Sn | 1 μm | 0 μm | ○ | YES |

With reference to Table 1, in the reference sample No. 1, Sn atoms are spread into a range of about 1 μm thickness from the front surface of the Cu electrode pads 11A and 11B simultaneously with the electroless plating film deposition, which results in formation of the intermetallic compound $Cu_6Sn_5$. Accordingly, the Sn layer is depleted on the surfaces of the Cu electrode pads 11A and 11B. As a result, if a reflowing process is performed after forming a Bi layer, the solder layers on the Cu electrode pads 11A and 11B cannot be meted.

On the other hand, if the film thickness of the Sn-plated layer is increased such as in the reference samples No. 2 and No. 3, the Sn layer remains and the solder layer can be melted. However, because the film thickness of the Sn-plated layer is increased, short-circuiting occurs between the adjacent Cu electrode pads 11A and 11B. In Table 1, "x" indicates that melting did not occur in the solder layer, "Δ" indicates an incomplete melting occurred, and "○" indicates that a complete melting occurred.

On the other hand, the formation of an intermetallic compound after the electroless plating process is not recognized in the structure of the present embodiment in which the Bi-plated layer and the Sn-plated layer are formed on the Cu electrode pads 11A and 11B. Thus, it is appreciated that the solder layers on the Cu electrode pads 11A and 11B are surely melted.

However, if the film thickness of the Sn-plated layer 13 is increased, short-circuiting occurs between the adjacent Cu electrode pads 11A and 11B. Thus, it is desirable to set the film thickness of the Sn-plated layer 13 to about 1 μm.

It should be noted that the electroless plating process to form the Bi-plated layer 12 illustrated in FIG. 2B may be performed by electroless plating at 40° C. using an electroless plating solution containing 30 g/L of $BiCl_3$, 100 g/L of $C_5H_5O_7Na_3.2H_2O$, 30 g/L of $C_{10}H_{14}Na_2O_3.2H_2O$, 40 g/L of $N(CH_2COOH)_3$ and 5 g/L of $SnCl_2.2H_2O$.

Figure 6A:
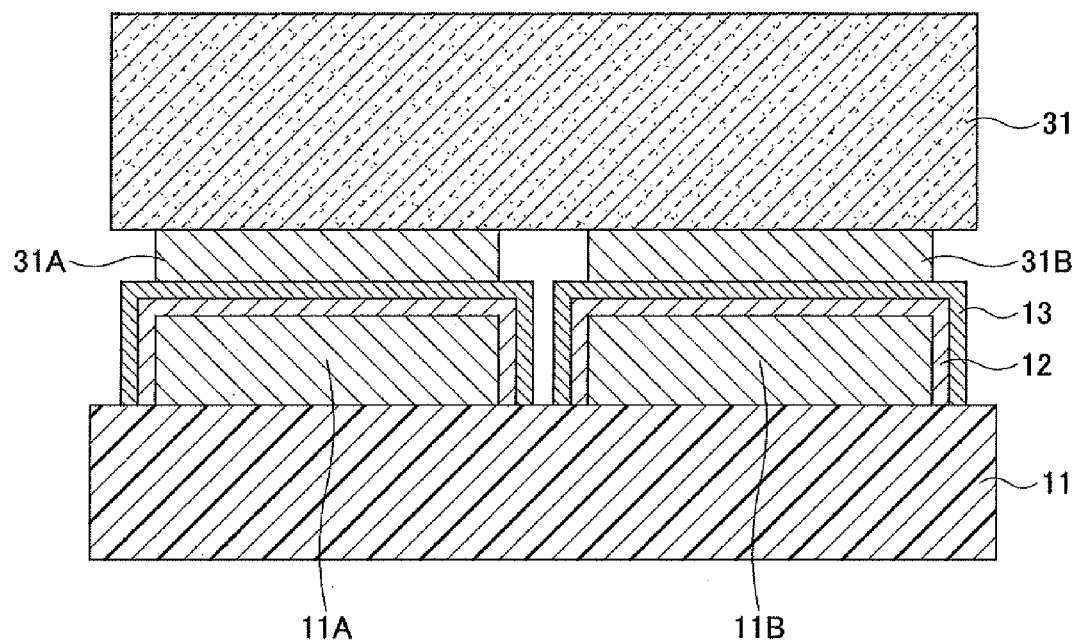
FIG. 6A is a cross-sectional view for explaining a process of mounting a semiconductor chip to the printed wiring board illustrated in FIG. 2C.
Figure 6B:
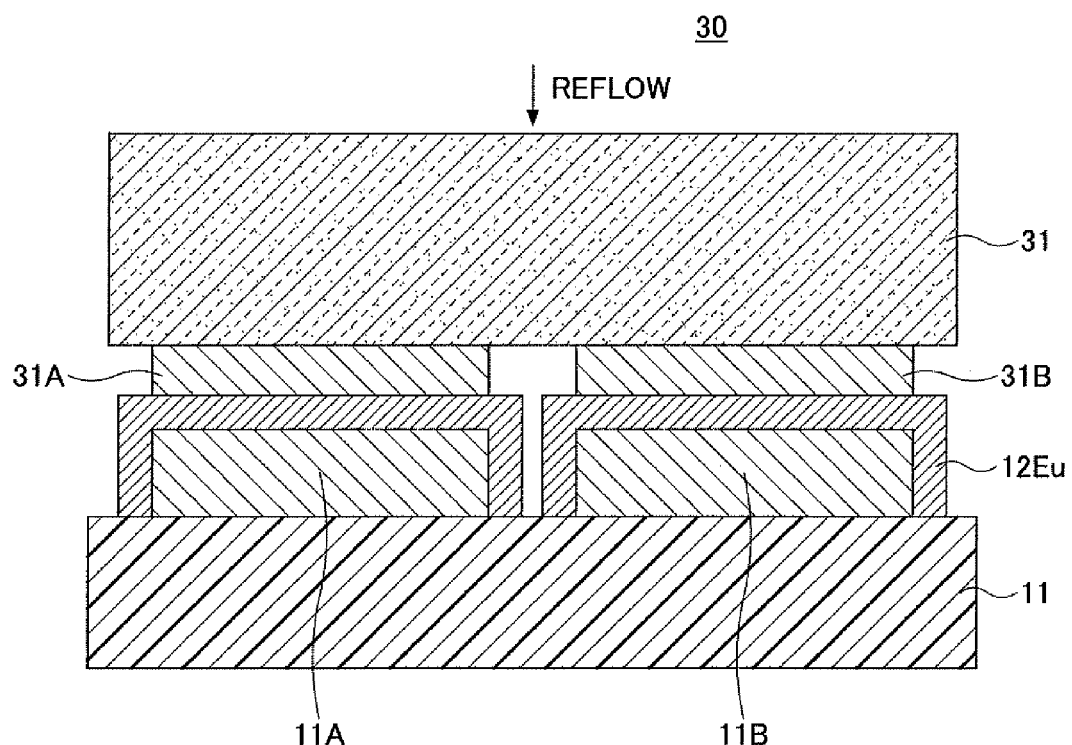
FIG. 6B is a cross-sectional view for explaining a process of mounting a semiconductor chip to the printed wiring board illustrated in FIG. 2C.
Figure 7:
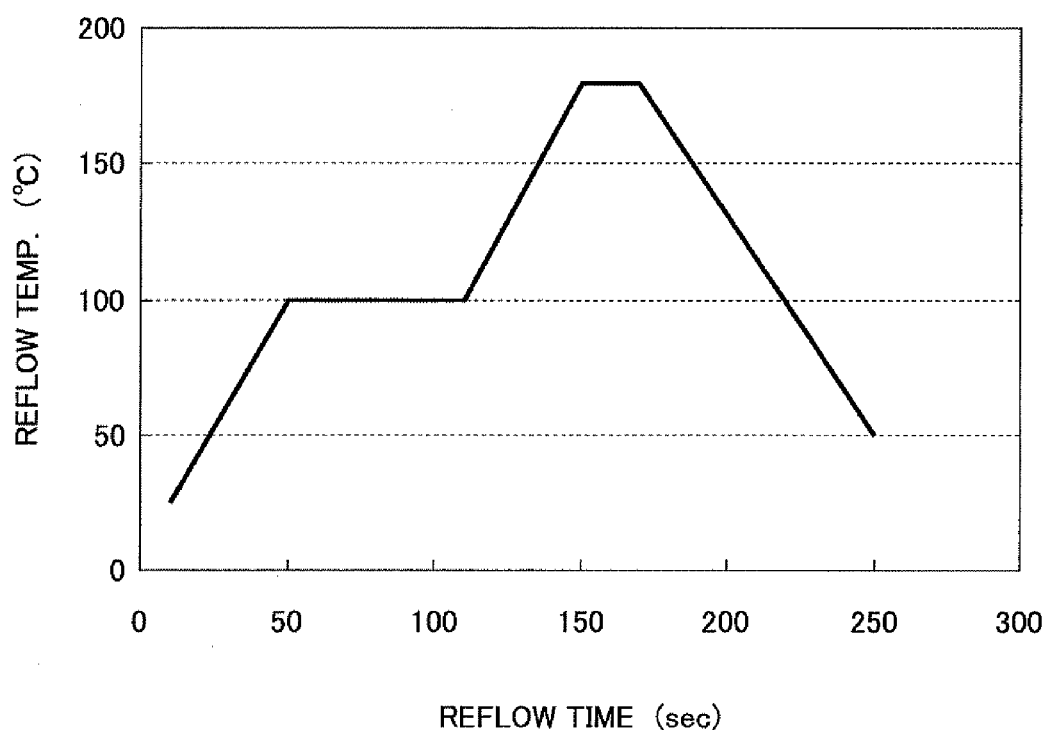
FIG. 7 is a graph indicating a temperature change curve used in the first embodiment.

Furthermore, according to the present embodiment, by flip-chip mounting the semiconductor chip 31, as illustrated in FIG. 6A, on the printed wiring board 10 of FIG. 1 and performing a reflowing process according to a temperature change curve illustrated in FIG. 7, melting of the solder layers 12A and 12B is induced at a temperature below 200° C. in order to manufacture the electronic device 30 in which the semiconductor chip 31 is mounted as illustrated in FIG. 6B. In FIG. 6B, as a result of the reflowing process, the solder layers 12A and 12B are changed into a Sn—Bi alloy solder layer 12Eu of an eutectic composition or a composition close to the eutectic composition. As a result, the electrode pads 31A and 31B on the bottom surface of the semiconductor chip 31 can be joined to the Cu electrode pads 11A and 11B, respectively, at a temperature below 200° C.

According to the temperature change curve illustrated in FIG. 7, the maximum temperature is below 200° C. Thus, a semiconductor chip is prevented from being damaged even if a porous low-dielectric constant material is used as an interlayer insulating material of the semiconductor chip. Additionally, according to the temperature change curve illustrated in FIG. 7, the maximum temperature is higher than 139° C., which is an eutectic temperature of an Sn—Bi alloy. Thereby, the solder layer can be surely melted even if an amount ratio of the Bi-plated layer 12 and the Sn-plated layer 13 is slightly shifted from that of the eutectic composition.

Figure 8:
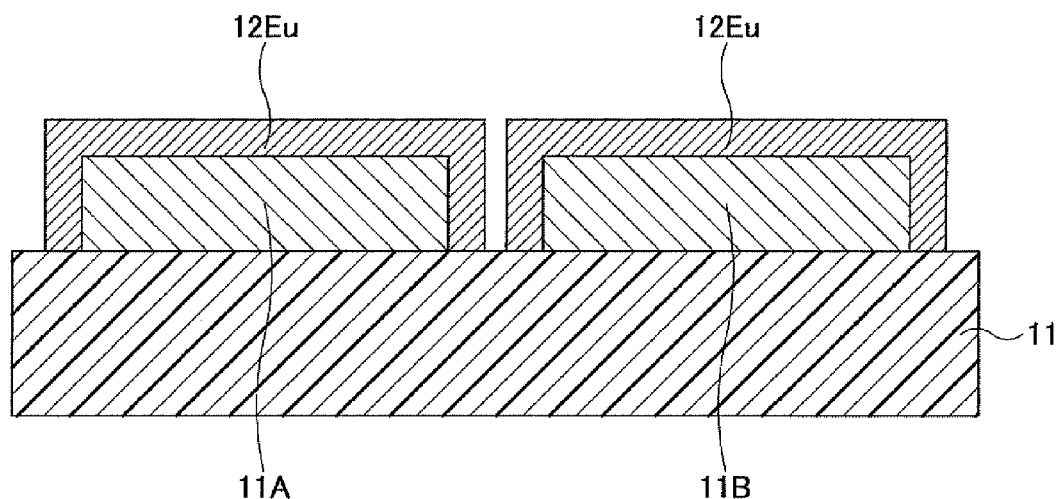
FIG. 8 is a cross-sectional view of a part of a printed wiring board according to a variation of the first embodiment.

Moreover, as illustrated in FIG. 8, it is possible to form a printed wiring board 10A in which the solder layers 12A and 12B are changed into the Sn—Bi alloy solder layer 12Eu in the printed wiring board 10 of FIG. 1.

A description will be given below of a second embodiment.

FIGS. 9A through 9F are cross-sectional views for explaining a manufacturing process of a printed wiring board according to a second embodiment. In FIGS. 9A through 9F, parts that are the same as the parts explained before are given the same reference numerals, and descriptions thereof are omitted.

Figure 9A:
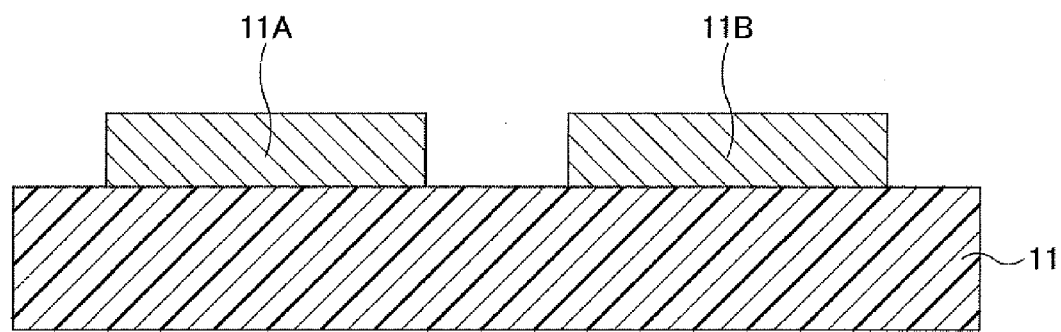
FIG. 9A is a cross-sectional view for explaining a first process of manufacturing a printed wiring board according to a second embodiment.

Referring to FIG. 9A, similar to the structure illustrated in FIG. 2A, the Cu electrode pads 11A and 11B are formed on the substrate 11 of the printed wiring board 20. However, in the present embodiment, a Sn sacrifice layer 13S having a film thickness of, for example, about 1 μm is formed on each of the Cu electrode pads 11A and 11B by an electroless plating method.

For example, in the structure illustrated in FIG. 9A, similar to the above-mentioned first embodiment, the film deposition of the Sn sacrifice layer 13A is performed after washing the Cu electrode pads 11A and 11B with a 10% sulfuric acid solution and drying it in a nitrogen gas atmosphere.

Figure 9B:
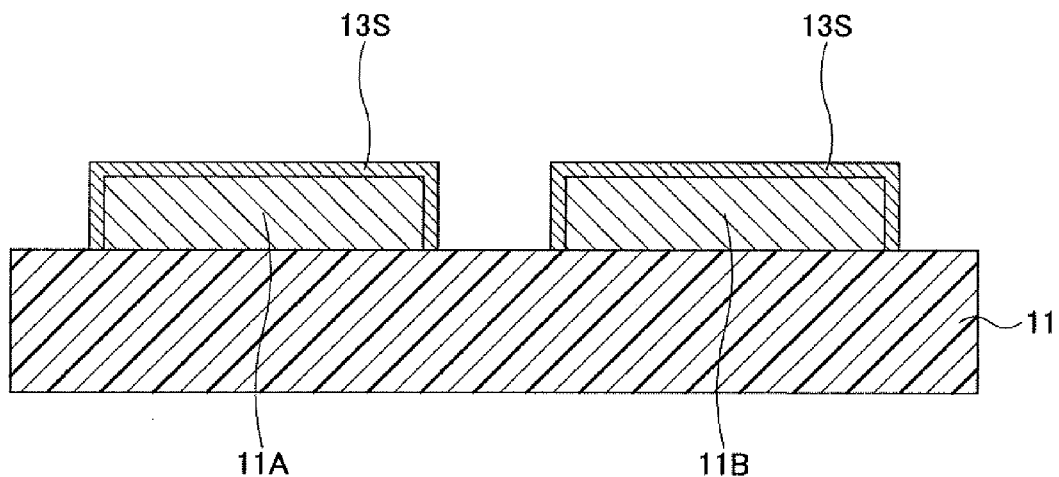
FIG. 9B is a cross-sectional view for explaining a second process of manufacturing the printed wiring board according to the second embodiment.

Furthermore, in the process of FIG. 9B, the structure of FIG. 9A is immersed into an electroless plating solution, which contains 25 g/L of $SnCl_2$, 70 g/L of $CS(NH_2)_2$, 50 g/L of HCl, 15 g/L of $NaHPO_2.2H_2O$ and 0.5 g/L of surfactant, at 70° C. for 3 minutes in order to form the Sn sacrifice layer 13S. Here, a part of Sn atoms of the Sn sacrifice layer 13A spreads into the Cu electrode pad 11A or 11B during the film depositing process, which forms the intermetallic compound $Cu_6Sn_5$ mentioned before. However, because the film depositing process time is short, a large part of the Sn sacrifice layer 13A remains on the Cu electrode pad 11A or 11B in the state illustrated in FIG. 9B.

Figure 9C:
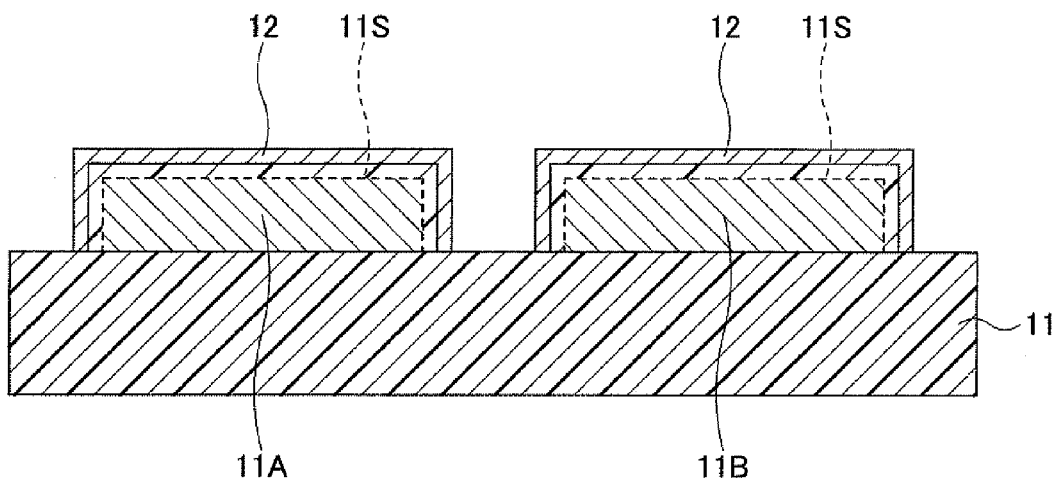
FIG. 9C is a cross-sectional view for explaining a third process of manufacturing the printed wiring board according to the second embodiment.

Then, after washing the structure illustrated in FIG. 9B with pure water for 30 seconds in the process of FIG. 9C, the structure of FIG. 9B is immersed into an electroless plating solution, which contains 1-10 g/L of bismuth nitrate, 5-60 g/L of thiourea and 5-10 g/L of nitric acid, at 50° C. for 10 minutes. Thereby, the Bi-plated layer 12 is formed on each of the Cu electrode pads 11A and 11B as illustrated in FIG. 9C with a film thickness of about 1 μm. During the formation of the Bi-plated layer 12, Sn atoms forming the Sn sacrifice layer 13A spread into the Cu electrode pad 11A or 11B. As a result, an interface area 11S containing the intermetallic compound $Cu_6Sn_5$ is formed along the Cu electrode pad 11A or 11B. However, in the state illustrated in FIG. 9C, because the film thickness of the Sn sacrifice layer 13A is as small as 1 μm, the interface area 11S is limited in a range of about 0.2 μm of the surface of the Cu electrode pad 11A or 11B. Additionally, the Sn sacrifice layer 13S does not remain on the surface of the Cu electrode pad 11A or 11B. That is, there is no Sn layer existing between the Bi-plated layer and the Cu electrode pad 11A or 11B.

Then, the structure illustrated in FIG. 9C is washed with pure water for 30 seconds. Thereafter, in the process of FIG. 9D, the structure of FIG. 9C is immersed into a Cu electroless plating solution at 40° C. for 5 minutes. As for the Cu electroless plating solution, "throucup PRX" manufactured by Uemura Kogyo Company Limited may be used. Thereby, a Cu sacrifice layer 11T having a thickness of about 0.5 μm is formed on the outer side of the Bi-plated layer 12 as illustrated in FIG. 9D.

Figure 9D:
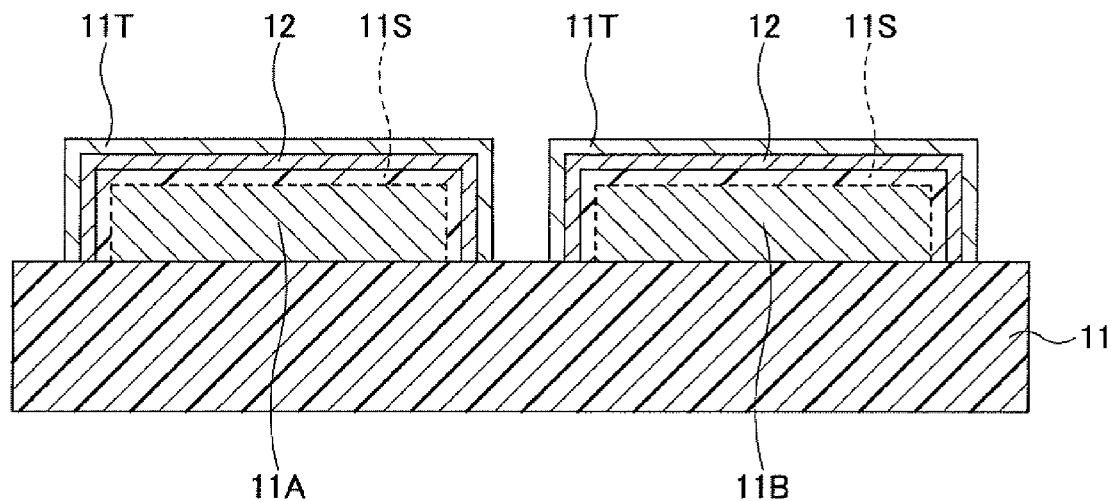
FIG. 9D is a cross-sectional view for explaining a fourth process of manufacturing the printed wiring board according to the second embodiment.
Figure 9E:
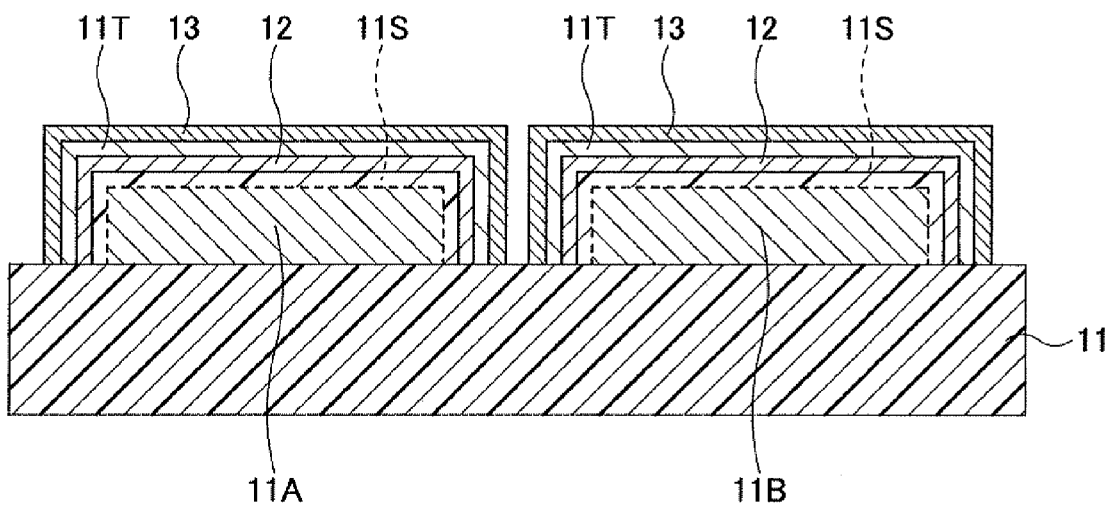
FIG. 9E is a cross-sectional view for explaining a fifth process of manufacturing the printed wiring board according to the second embodiment.
Figure 9F:
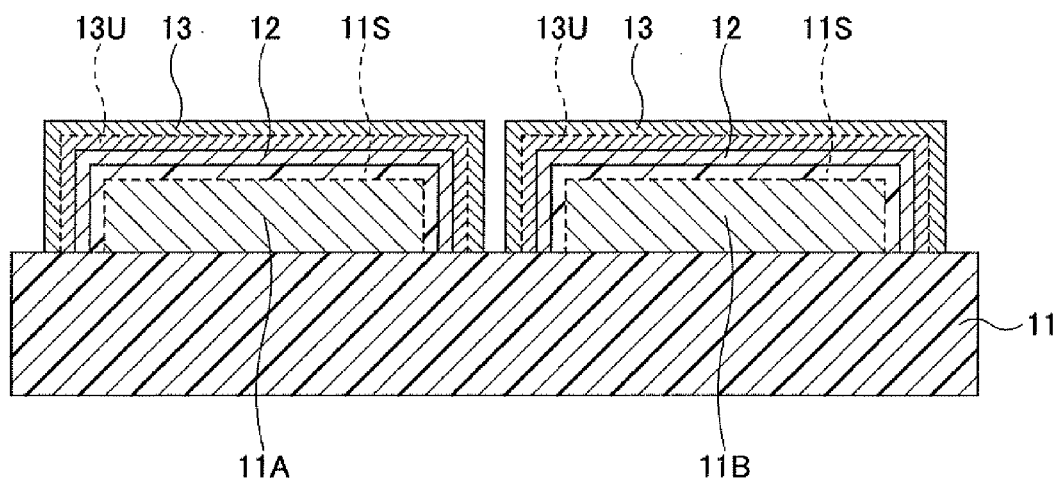
FIG. 9F is a cross-sectional view for explaining a sixth process of manufacturing the printed wiring board according to the second embodiment.

Then, the structure illustrated in FIG. 9D is immersed into an electroless plating solution, which contains 25 g/L of $SnCl_2$, 70 g/L of $CS(NH_2)_2$, 50 g/L of HCl, 15 g/L of $NaHPO_2.2H_2O$ and 0.5 g/L of surfactant, at 70° C. for 3 minutes in order to form the Sn sacrifice layer 13S as illustrated in FIG. 9E. At this time, Sn atoms spread into the previously formed Cu sacrifice layer 11T. Thus, the Cu sacrifice layer 11T is changed into a Sn layer interface area 13U containing Cu atoms.

In the present embodiment, because the formation of the Bi-plated layer 12 is performed on the Sn sacrifice layer 13A, which has an affinity to the Bi layer, when forming the Bi-plated layer 12, the Bi-plated layer 12 is made flat and there is no island-form growth such as in the above-mentioned embodiment. Thus, when forming the Sn-plated layer 13, Sn atoms are prevented from spreading from the Sn-plated layer 13 into the Cu electrode pad 11A or 11B more efficiently than the case of the above-mentioned embodiment, thereby more accurately controlling the composition of the solder layers 12A ad 12B including the thus-formed Sn/Bi lamination structure to be close to the eutectic composition.

A description will be given below, with reference to FIGS. 10A through 10L, of a third embodiment.

Figure 10A:
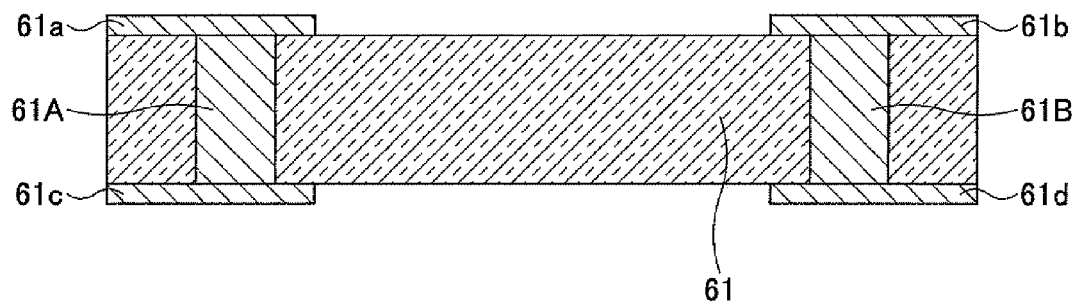
FIG. 10A is a cross-sectional view for explaining a first process of manufacturing a printed wiring board according to a third embodiment.

Referring to FIG. 10A, through vias 61A and 61B, which are Cu plugs, are formed in a core substrate 61. Cu wiring patterns 61a and 61b are formed on a top surface of the core substrate 61. Cu wiring patterns 61c and 61d are formed on a bottom surface of the core substrate 61.

Figure 10B:
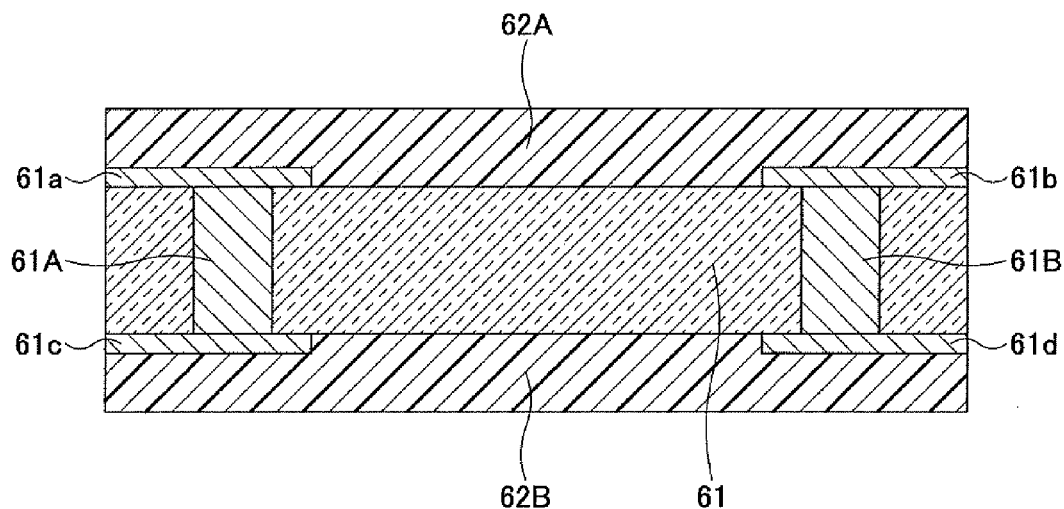
FIG. 10B is a cross-sectional view for explaining a second process of manufacturing the printed wiring board according to the third embodiment.

As illustrated in FIG. 10B, a low-dielectric resin film 62A is formed on the top surface of the core substrate 61 to cover the Cu wiring patterns 61a and 61b, and a low-dielectric resin film 62B such as NCS is formed on the bottom surface of the core substrate 61 to cover the Cu wiring patterns 61c and 61d.

Figure 10C:
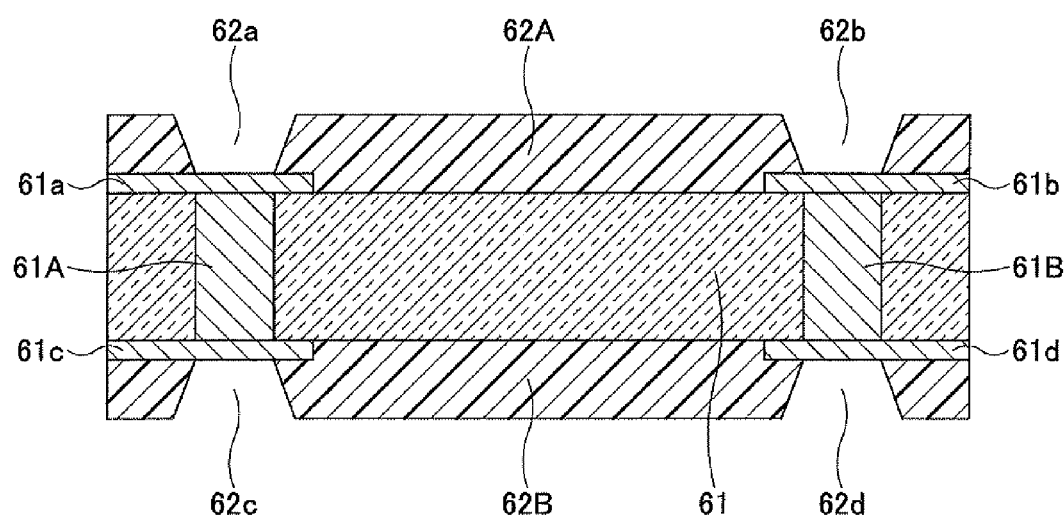
FIG. 10C is a cross-sectional view for explaining a third process of manufacturing the printed wiring board according to the third embodiment.

Then, as illustrated in FIG. 10C, opening parts 62a and 62b are formed in the low-dielectric resin film 62A to expose the Cu wiring patterns 61a and 61b, respectively, and opening parts 62c and 62d are formed in the low-dielectric resin film 62B to expose the Cu wiring patterns 61c and 61d, respectively.

Figure 10D:
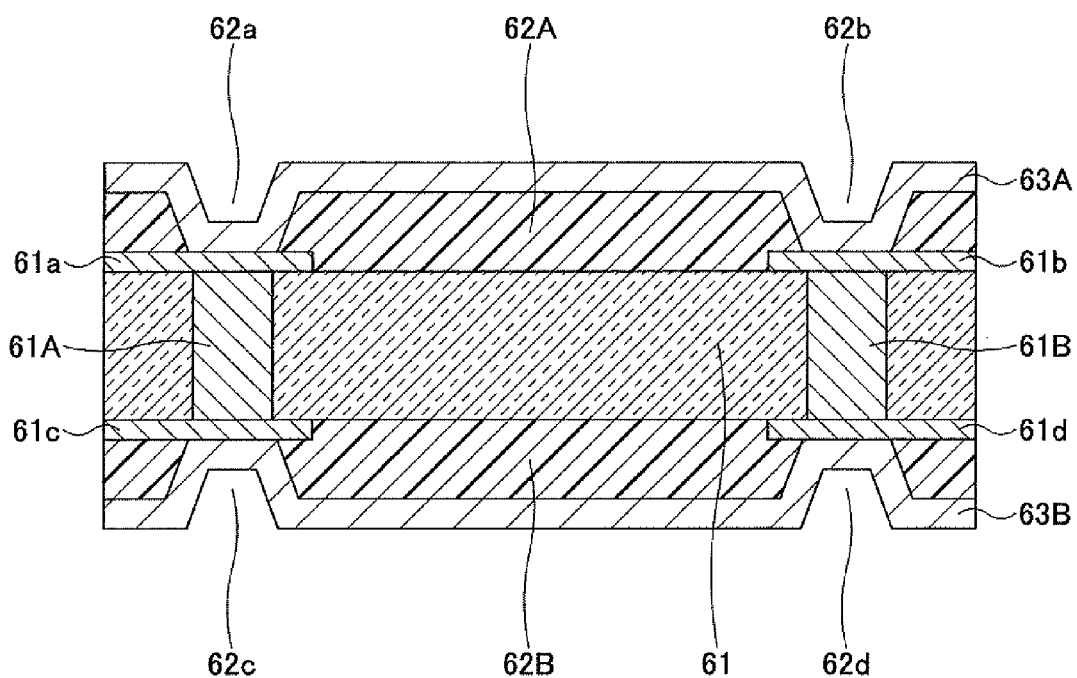
FIG. 10D is a cross-sectional view for explaining a fourth process of manufacturing the printed wiring board according to the third embodiment.

Then, as illustrated in FIG. 10D, a Cu seed layer 63A is formed on the low-dielectric resin film 62A by electroless plating to cover the opening parts 62a and 62b, and, simultaneously, a Cu seed layer 63B is formed on the low-dielectric resin film 62B by electroless plating to cover the opening parts 62c and 62d.

Figure 10E:
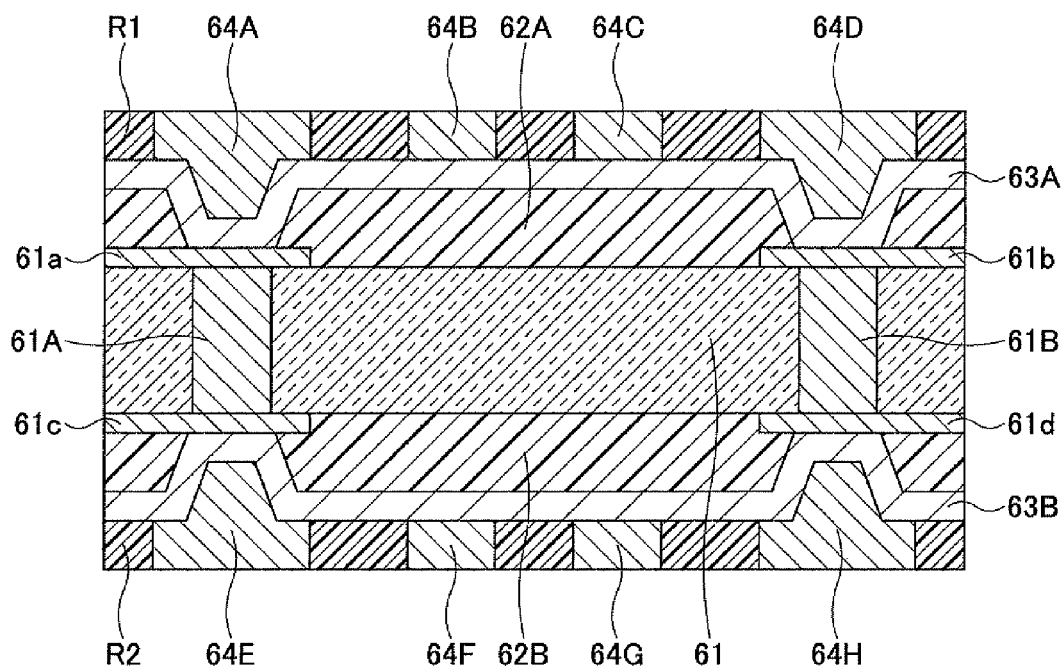
FIG. 10E is a cross-sectional view for explaining a fifth process of manufacturing the printed wiring board according to the third embodiment.

Further, as illustrated in n FIG. 10E, a resist pattern R1, which has opening parts corresponding to wiring patterns to be formed, is formed on the Cu seed layer 63A, and, similarly, a resist pattern R2, which has opening parts corresponding to wiring patterns to be formed, is formed on the Cu seed layer 63B.

Then, in the process illustrated in FIG. 10E, Cu wiring patters 64A through 64H are formed in the openings of the resist patterns R1 and R2 by electrolytic plating using the Cu seed layers 63A and 63B as electrodes.

Figure 10F:
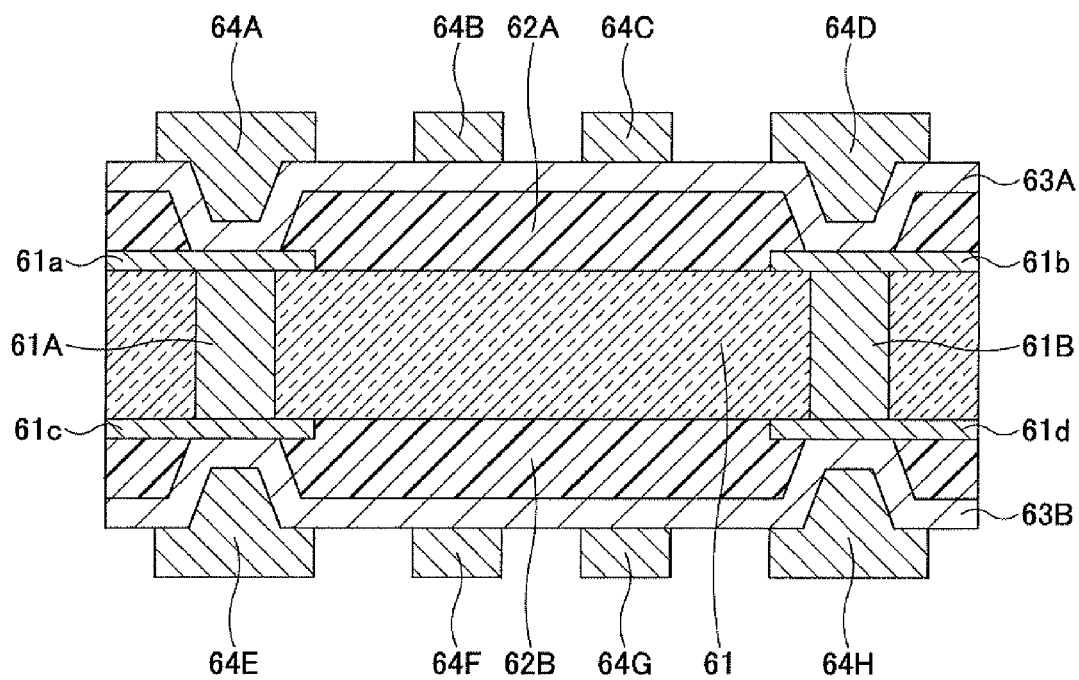
FIG. 10F is a cross-sectional view for explaining a sixth process of manufacturing the printed wiring board according to the third embodiment.

Thereafter, as illustrated in FIG. 10F, the resist patterns R1 and R2 are removed. Then, portions of the Cu seed layers 63A and 63B, which are exposed by sputtering, are removed, and the thus-formed Cu wiring patterns 64A through 64H are separated from each other.

Figure 10G:
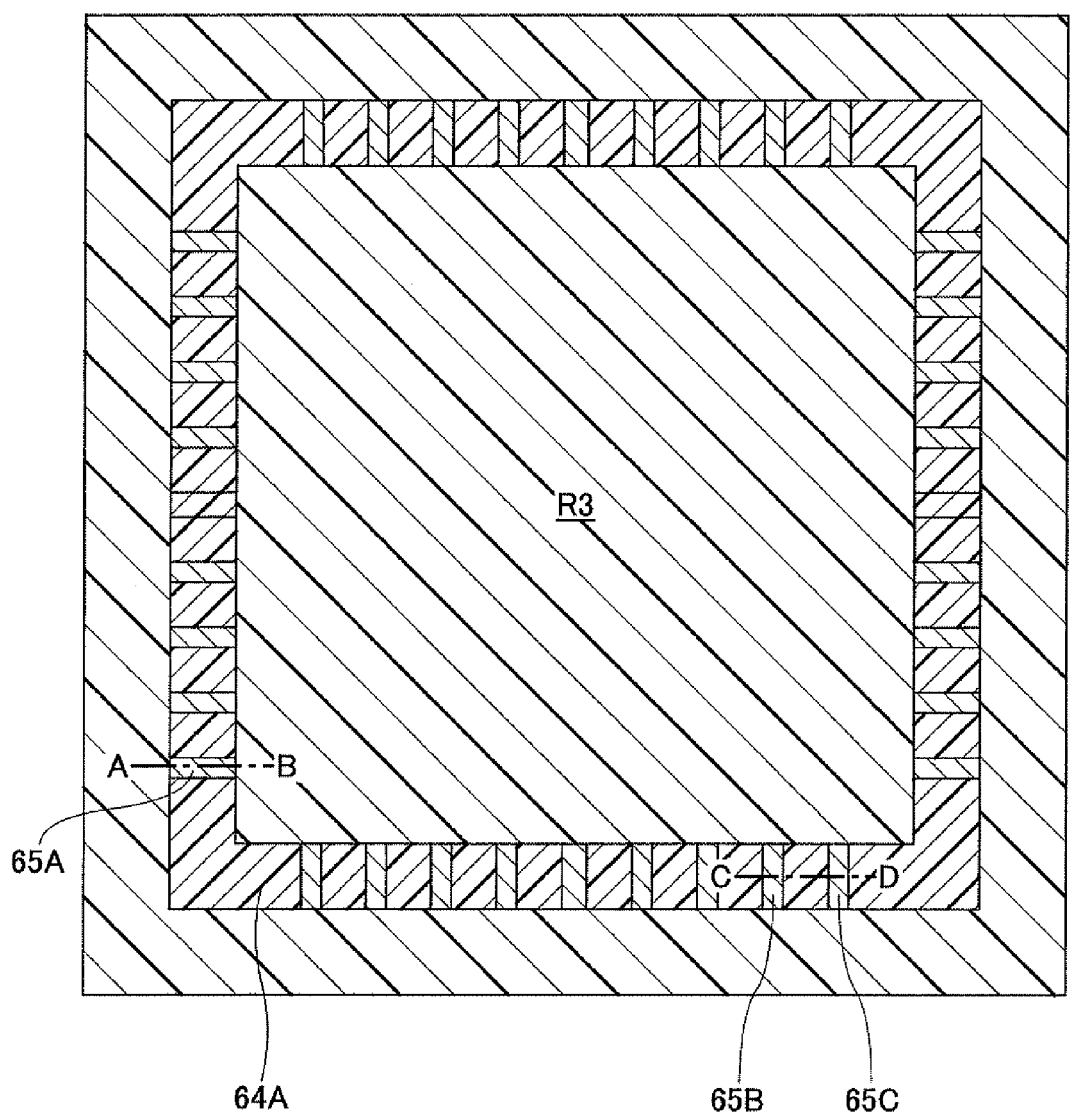
FIG. 10G is a plan view for explaining a seventh process of manufacturing the printed wiring board according to the third embodiment.
Figure 10H:
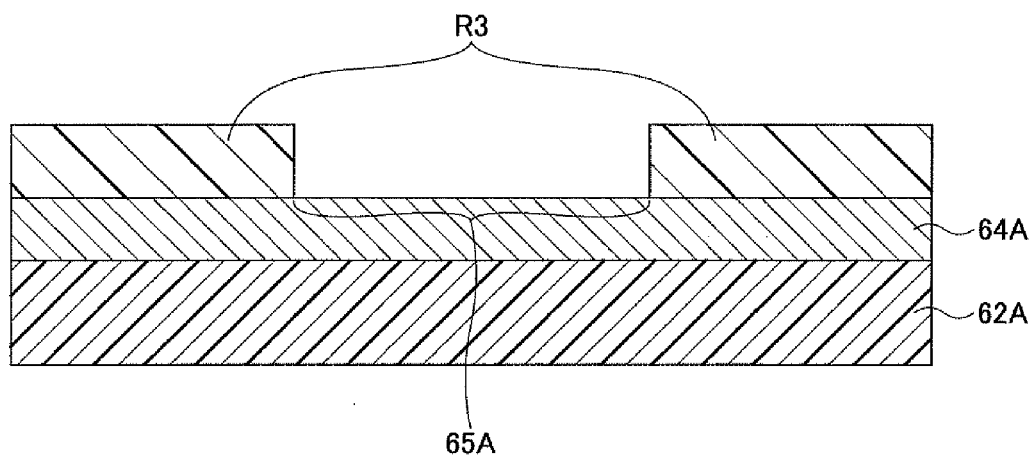
FIG. 10H is a cross-sectional view taken along a line A-B of FIG. 10G.
Figure 10I:
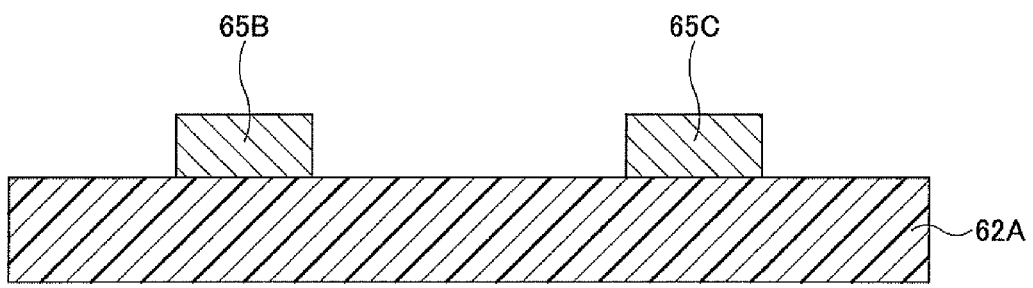
FIG. 10I is a cross-sectional view taken along a line C-D of FIG. 10G.

Then, as illustrated in FIGS. 10G through 10I, a solder resist film R3 is formed on the top surface of the thus-formed printed wiring board so that pad electrode forming portions 65A through 65C are exposed from among the Cu wiring patterns formed on the top surface of the printed wiring board including the wiring patterns 64A through 64D. FIG. 10G is a plan view of the top surface of the printing wiring board on which the solder resist film R3 is formed. FIG. 10H is a cross-sectional view taken along a line A-B of FIG. 10G. FIG. 10I is a cross-sectional view taken along a line C-D of FIG. 10G.

Figure 10J:
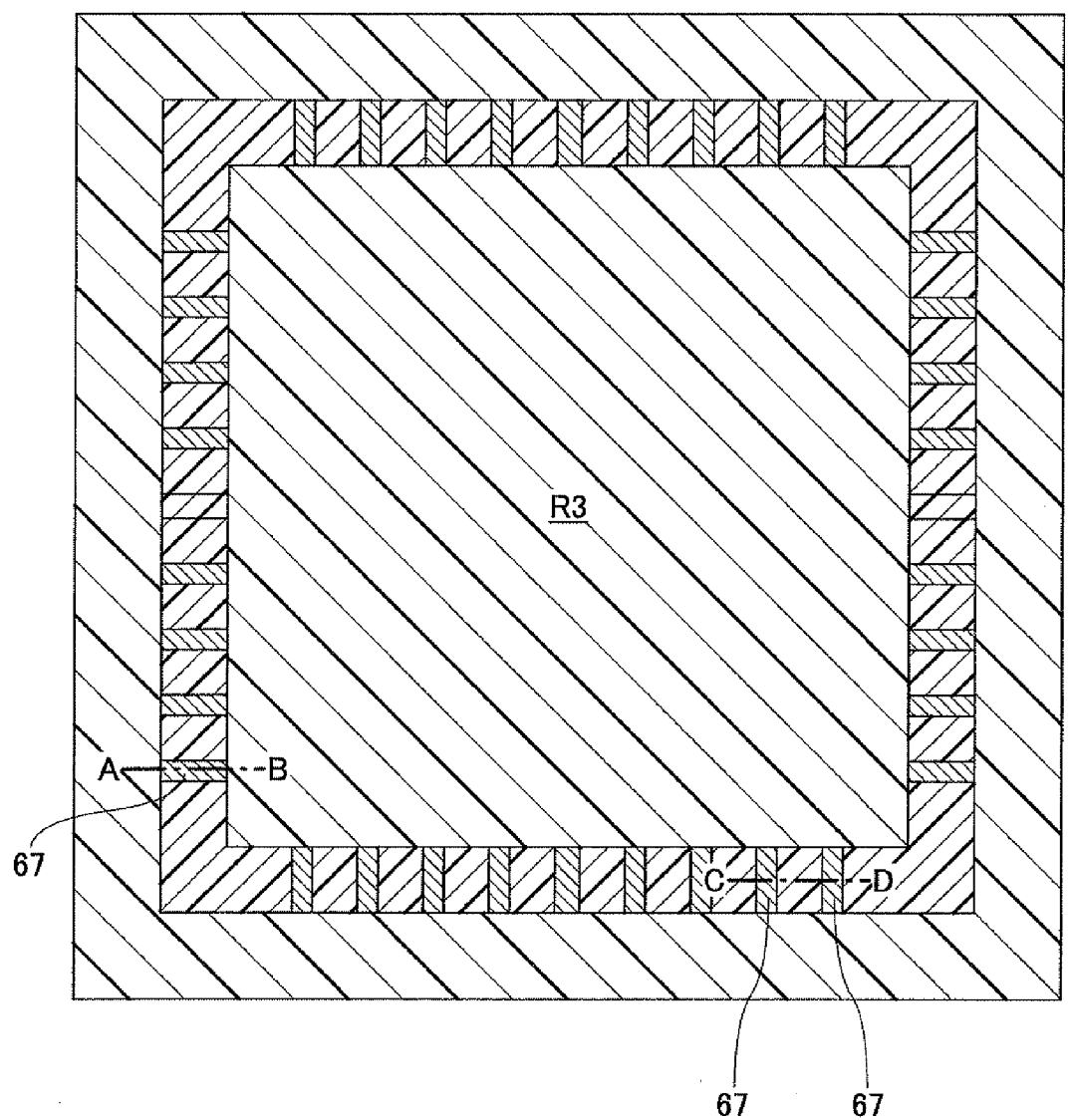
FIG. 10J is a plan view for explaining an eighth process of manufacturing the printed wiring board according to the third embodiment.
Figure 10K:
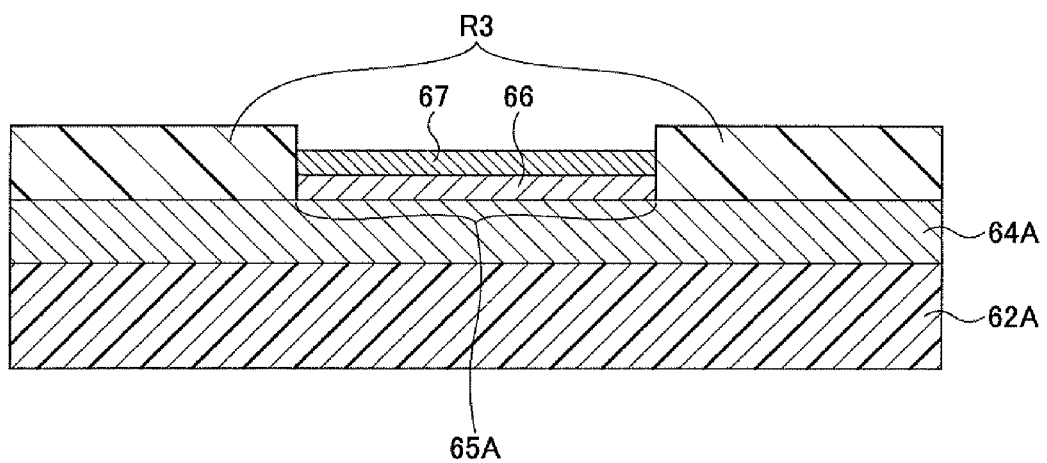
FIG. 10K is a cross-sectional view taken along a line A-B of FIG. 10J.
Figure 10L:
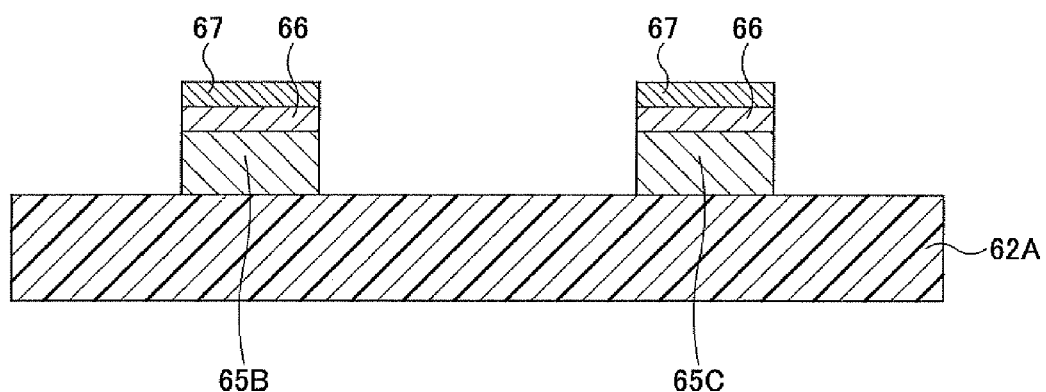
FIG. 10L is a cross-sectional view taken along a line C-D of FIG. 10J.

Then, as illustrated in FIGS. 10J through 10L, electroless plating is performed using the solder resist film R3 as a mask to form a Bi-plated layer 66 corresponding to the Bi-plated layer 12 in the above-mentioned first embodiment and to form a Sn-plated layer 67 corresponding to the Sn-plated layer 13 in the above-mentioned first embodiment. Each of the Bi-plated layer 66 and the Sn-plated layer 67 has a film thickness of about 1 μm.

As explained before, the Bi-plated layer 66 and the Sn-plated layer 67 together form an eutectic solder layer having a Sn—Bi lamination structure. However, as mentioned above, the Bi-plated layer 66 is formed on portions in contact with the pad electrode forming portions (Cu electrode pads) 65A through 65C. Thus, unlike an eutectic solder layer having a conventional lamination structure in which a Sn-plated layer is directly in contact with a Cu electrode pad, Sn atoms are not depleted. Thus, when it is subject to a reflowing process, a Sn—Bi eutectic solder having a low melting temperature is formed without increasing the thickness of the Sn-plated layer, thereby enabling mounting an electronic device on the thus-formed printed wiring board at a joining temperature below 200° C.

According to the above-mentioned embodiments, there is no short-circuiting occurs even in a structure in which Cu electrode pads are arranged at very small intervals because the film thickness of the solder layers formed on the Cu electrode pads can be reduced.

In the embodiments explained above, instead of the Bi-plated layer 12 or 66, other metal elements may be used, which have a small reactivity with Cu and do not form an intermetallic compound with Cu. For example, lead (Pb), indium (In), silver (Ag) or an alloy containing Bi, Pb, In or Ag as a major component may be used instead of Bi.

Moreover, instead of the Sn-plated layer 13 or 67, other metals forming an eutectic solder with the Bi-plated layer 12 or 66, such as, for example, gold (Au) or an alloy containing Sn or Au as a major component, may be used.

All examples and conditional language recited herein are intended for pedagogical purposes to aid the reader in understanding the principles of the invention and the concepts contributed by the inventor to furthering the art, and are to be construed a being without limitation to such specifically recited examples and conditions, nor does the organization of such examples in the specification relates to a showing of the superiority and inferiority of the invention. Although the embodiment(s) of the present invention (s) has(have) been described in detail, it should be understood that the various changes, substitutions, and alterations could be made hereto without departing from the spirit and scope of the invention.

What is claimed is:

1. A manufacturing method of a printed wiring board, comprising:
    forming a first metal layer on a Cu wiring pattern formed on a substrate;
    forming a second metal layer on said first metal layer; and
    after forming said first and second metal layers, reflowing said first and second metal layers simultaneously to produce an eutectic reaction between said first and second metal layers,
    wherein said first metal layer has a less reactivity with Cu than said second metal layer,
    the manufacturing method further comprising:
    forming a first sacrifice layer between said substrate and said first metal layer, the first sacrifice layer having the same composition as said second metal layer; and
    forming a second sacrifice layer between said first metal layer and said second metal layer, the second sacrifice layer being formed of Cu,
    wherein said first sacrifice layer is depleted in a process of forming said first metal layer, and said second sacrifice layer is depleted in a process of forming said second metal layer.

2. The manufacturing method according to claim 1, wherein said second metal layer forms an intermetallic compound with Cu, and said first metal layer does not form an intermetallic compound with Cu.

3. The manufacturing method according to claim 1, wherein said first metal layer is made of a metal element selected from a group consisting of bismuth, lead, indium and silver or an alloy containing one of bismuth, lead, indium and silver as a major component, and said second metal layer is made of a metal element selected from a group consisting of tin and gold or an alloy containing one of tin and gold as a major component.

4. The manufacturing method according to claim 1, wherein said eutectic reaction is produced in a temperature range from 139° C. to 150° C.

* * * * *